US 6,326,649 B1

(12) United States Patent
Chang et al.

(10) Patent No.: US 6,326,649 B1
(45) Date of Patent: Dec. 4, 2001

(54) PIN PHOTODIODE HAVING A WIDE BANDWIDTH

(75) Inventors: Chia C. Chang, Berkeley Heights; Robert Eugene Frahm, Flemington; Keon M. Lee, Bellemead, all of NJ (US); Orval George Lorimor, Wolfeboro, NH (US); Dennis Ronald Zolnowski, Bridgewater, NJ (US)

(73) Assignee: Agere Systems, Inc., Miami Lakes, FL (US)

( * ) Notice: Subject to any disclaimer, the term of this patent is extended or adjusted under 35 U.S.C. 154(b) by 0 days.

(21) Appl. No.: 09/229,426

(22) Filed: Jan. 13, 1999

(51) Int. Cl.[7] .................. H01L 31/072; H01L 31/109; H01L 31/0328; H01L 31/0336
(52) U.S. Cl. .................. 257/184; 257/185; 257/458; 257/464; 438/93; 438/94
(58) Field of Search .................. 257/458, 184, 257/185, 464; 438/93, 94

(56) References Cited

U.S. PATENT DOCUMENTS

| 4,183,034 | 1/1980 | Burke et al. | 357/30 |
|---|---|---|---|
| 4,784,702 | 11/1988 | Henri | 136/258 |
| 4,885,622 | 12/1989 | Uchiyama et al. | 357/30 |
| 4,904,608 | 2/1990 | Gentner et al. | 437/3 |
| 4,999,696 | 3/1991 | Gentner et al. | 357/30 |
| 5,045,908 | 9/1991 | Lebby | 357/30 |
| 5,304,824 | * 4/1994 | Tonai | 257/183 |
| 5,528,071 | 6/1996 | Russell et al. | 257/458 |
| 5,557,117 | * 9/1996 | Matsuoka et al. | 257/184 |
| 5,682,037 | * 10/1997 | de Cesare et al. | 250/372 |
| 5,818,096 | 10/1998 | Ishibashi et al. | 257/458 |
| 5,998,806 | * 12/1999 | Stiebig et al. | 257/55 |

* cited by examiner

Primary Examiner—William Mintel
(74) Attorney, Agent, or Firm—Thomas, Kayden, Horstemeyer & Risley LLP

(57) ABSTRACT

A PIN photodiode comprising a p region containing a p type dopant, an n region containing an n type dopant, an i region positioned intermediate the p region and the n region, and a relatively thick, undoped buffer region positioned between the n region and the i region which substantially decreases the capacitance of the PIN photodiode such that the photodiode bandwidth is maximized. Typically, the buffer region is formed as a layer of indium phosphide that is at least approximately 0.5 $\mu$m in thickness.

15 Claims, 4 Drawing Sheets

PIN PHOTODIODE HAVING A WIDE BANDWIDTH

FIELD OF THE INVENTION

The invention relates generally to PIN photodiodes. More particularly, the invention relates PIN photodiodes having wide bandwidths.

BACKGROUND OF THE INVENTION

Fiber optic communications typically employ a modulated light source, such as a laser, a photodiode light detector, and an optical fiber interconnecting the laser and the photodiode. The laser typically is modulated to emit light pulses, which are to be received by remote photodiodes and converted into electrical signal outputs by the photodiodes.

Conventional photodiodes typically are arranged as PIN type photodiodes. FIG. 1 shows a common PIN photodiode 10 of the prior art. As shown in this figure, the photodiode 10 is constructed as a chip having three semiconductor regions: a p region 12, an n region 14, and an intermediate i (intrinsic) region 16. The p and n regions 12 and 14 normally are doped to high carrier concentrations while the i region 16 typically is unintentionally doped to have a small, residual p or n type carrier concentration. A p contact 18, or anode, is connected to the p region 12 and an n contact 20, or cathode, is connected to the n region 14. Normally, the p region 12 is coated with a dielectric coating 22 which prevents surface current leakage around the sides of the device and also serves as anti-reflective coating if the device is illuminated from the top side. The n region 14 is coated with an antireflective coating 24 which prevents reflection of the incident light away from the device. In some arrangements, a thin buffer coating (not shown) on the order of 0.1 µm to 0.2 µm is placed between the n region 14 and the i region 16 to prevent diffusion therebetween and avoid inadvertent doping of the i region.

PIN photodiodes such as that shown in FIG. 1 are negatively biased such that the entire i region 16 is depleted and substantially no current flows through the device under dark conditions. When incident light, for example light exiting an optical fiber, passes through either the transparent p region 12 or the transparent n region 14, it is absorbed by the i region 16 and the photons of light, hv, are converted into electron-hole pairs which create a net current flow through the photodiode 10.

A high performance photodiode must meet the speed requirements of high-bit-rate systems and must be efficient in converting optical signals at the operating frequencies to electrical signal current. Presently, high-bit-rate systems typically operate in the 10 Ghz to 20 Ghz frequency range. To meet the speed requirements of such systems, the photodiode used must have an adequately wide bandwidth. To operate at this wide bandwidth, the photodiode must be configured so as to minimize device capacitance. In particular, the capacitance of the pn junction, $C_j$, must be minimized. The junction capacitance can be calculated by the mathematical expression $C_j = \epsilon A/W$, where $\epsilon$ is the dielectric permittivity, A is the junction area, and W is the depletion region thickness. In keeping with this expression, previous attempts at minimizing device capacitance have focused on minimizing the junction area, A, and reducing the unintentional doping of the i region. Although an effective means of reducing capacitance, junction area minimization creates difficulties with optical fiber/photodiode alignment. Misalignment of the optical fiber with the photodiode can result in part or all of the optical signals not being absorbed in the i region of the photodiode, reducing the optical to electrical conversion efficiency and generating tails on the pulses resulting in a bandwidth reduction.

From the above expression, it is apparent that increasing the depletion region thickness, W, is another means of reducing capacitance. This normally is accomplished by increasing the thickness of the i region which, as mentioned above typically is completely depleted by the negative bias applied to the photodiode. Although increasing i region thickness does effectively reduce capacitance of the photodiode, attempts to do so create manufacturing difficulties. In particular, it is difficult to grow relatively thick i regions composed of, for example, indium gallium arsenide (InGaAs) with high yield results.

SUMMARY OF THE INVENTION

Briefly described, the present invention is a PIN photodiode comprising a p region containing a p type dopant, an n region containing an n type dopant, an i region positioned intermediate the p region and the n region, and a relatively thick, undoped buffer region positioned between the n region and the i region which substantially decreases the capacitance of the PIN photodiode such that the photodiode bandwidth is maximized. Preferably, the buffer region is formed as a layer of indium phosphide that is at least approximately 0.5 µm in thickness. Most preferably, the buffer region has a thickness of approximately 0.5 µm to 2.5 µm, which is drastically greater than prior art buffer region thickness.

The invention further relates to a method for increasing the bandwidth of a PIN photodiode comprising a p region, an n layer, and an i layer intermediate the p region and the n layer, comprising the step of providing a relatively thick, undoped buffer layer between the n layer and the i layer, wherein the buffer layer substantially decreases the capacitance of the PIN photodiode such that the photodiode bandwidth is maximized.

The objects, features, and advantages of this invention will become apparent upon reading the following specification, when taken in conjunction with the accompanying drawings. It is intended that all such additional features and advantages be included therein with the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
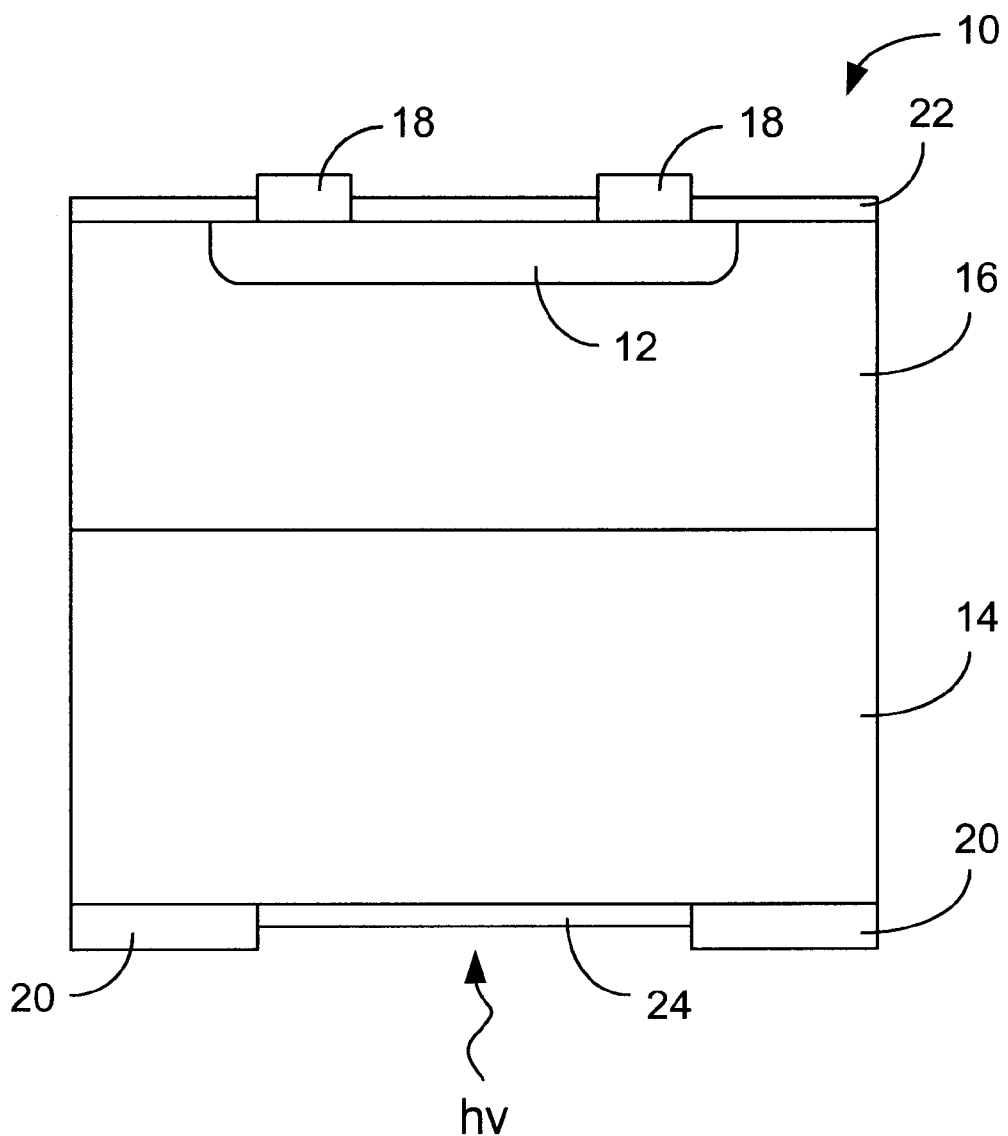
FIG. 1 is a PIN photodiode constructed in accordance with the prior art.
Figure 2:
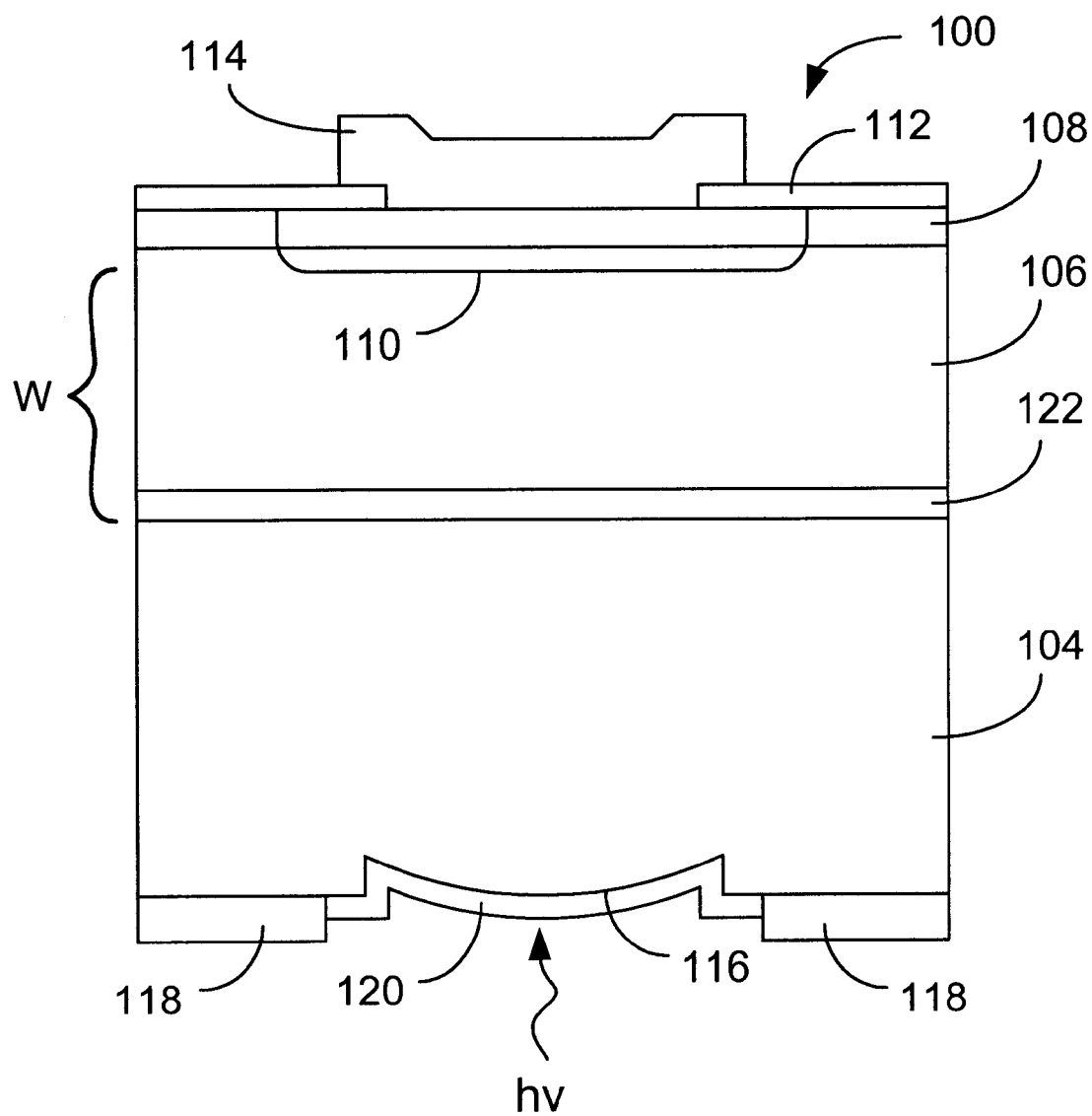
FIG. 2 is a PIN photodiode constructed in accordance with the present invention.

Referring now in more detail to the drawings, in which like reference numerals indicate corresponding parts throughout the several views, FIG. 2 illustrates a PIN photodiode 100 constructed in accordance with the present invention. As shown in this figure, the photodiode 100 is formed as a semiconductor chip that comprises a p region 102, an n region 104, and an i region 106 that is intermediate the p and n regions 102 and 104. Typically, the i region 106 takes the form of a layer of indium gallium arsenide (InGaAs) that is approximately 1 µm to 6 µm thick. Normally formed on the i region 106 is a cap layer 108 that prevents current leakage from the sides of the photodiode 100 and lowers contact resistance. The cap layer 108 typically is composed of indium phosphide (InP) or InGaAs and is approximately 0.25 µm to 1.5 µm thick. As indicated in FIG. 2, the p region 102 usually is formed in both the cap layer 108 and the i region 106 by diffusion with a p type dopant such as zinc (Zn). This p region 102 typically is approximately 0.35 µm to 3 µm in thickness and, together with the i region 106, forms a pn junction 110 that is approximately 12 µm to 500 µm in diameter.

A dielectric layer 112 normally is provided over the cap layer 108 and a portion of the p region 102 as shown in FIG. 2. This dielectric layer 112 typically is composed of silicon nitride ($SiN_x$) and serves to reduce the amount of dark current that flows on the surface of the device as well as provide a barrier against environmental contaminants. Mounted to the top of the PIN photodiode 100 is a p contact 114, or anode, that is connected to the p region 102. Normally, the p contact 114 is composed of one or more highly electrically conductive metals.

The n region 104 typically is formed as a layer of indium phosphide (InP) that contains an n type dopant such as sulfur (S). Normally, the n region is approximately 4 mils to 8 mils in thickness and includes an integral lens 116 that is etched into the n region which focuses the incident light, hv, on the pn junction 110. It is to be understood, however, that the photodiode 100 of the present invention would function adequately without the provision of an integral lens such as that shown in FIG. 2. Mounted to the n region at the bottom of the device 100 is an n contact 118, or cathode, which is composed of one or more highly electrically conductive metals. Irrespective of whether the n region is provided with an integral lens, the portion of the n region 104 not covered by the n contact 118, and therefore exposed to the incident light, hv, is covered with an antireflective coating 120 that typically is composed of silicon nitride ($SiN_x$).

Provided between the n region 104 and the i region 106 is a buffer region 122. This buffer region 122 normally takes the form of a relatively thick undoped layer of indium phosphide (InP). Similar to the function of thin buffer layers used in some known PIN photodiodes, the buffer region 122 prevents inadvertent doping of the i region 106 caused by solid state diffusion between the n and i regions 104 and 106. Unlike such buffer layers, however, the relatively large thickness of the buffer region 122 serves to substantially decrease capacitance in the PIN photodiode and thereby substantially increase the photodiode bandwidth as is discussed hereinafter. In use, the buffer region 122 is depleted along with the i region 106 by the reverse bias applied to the photodiode 100.

Figure 3:
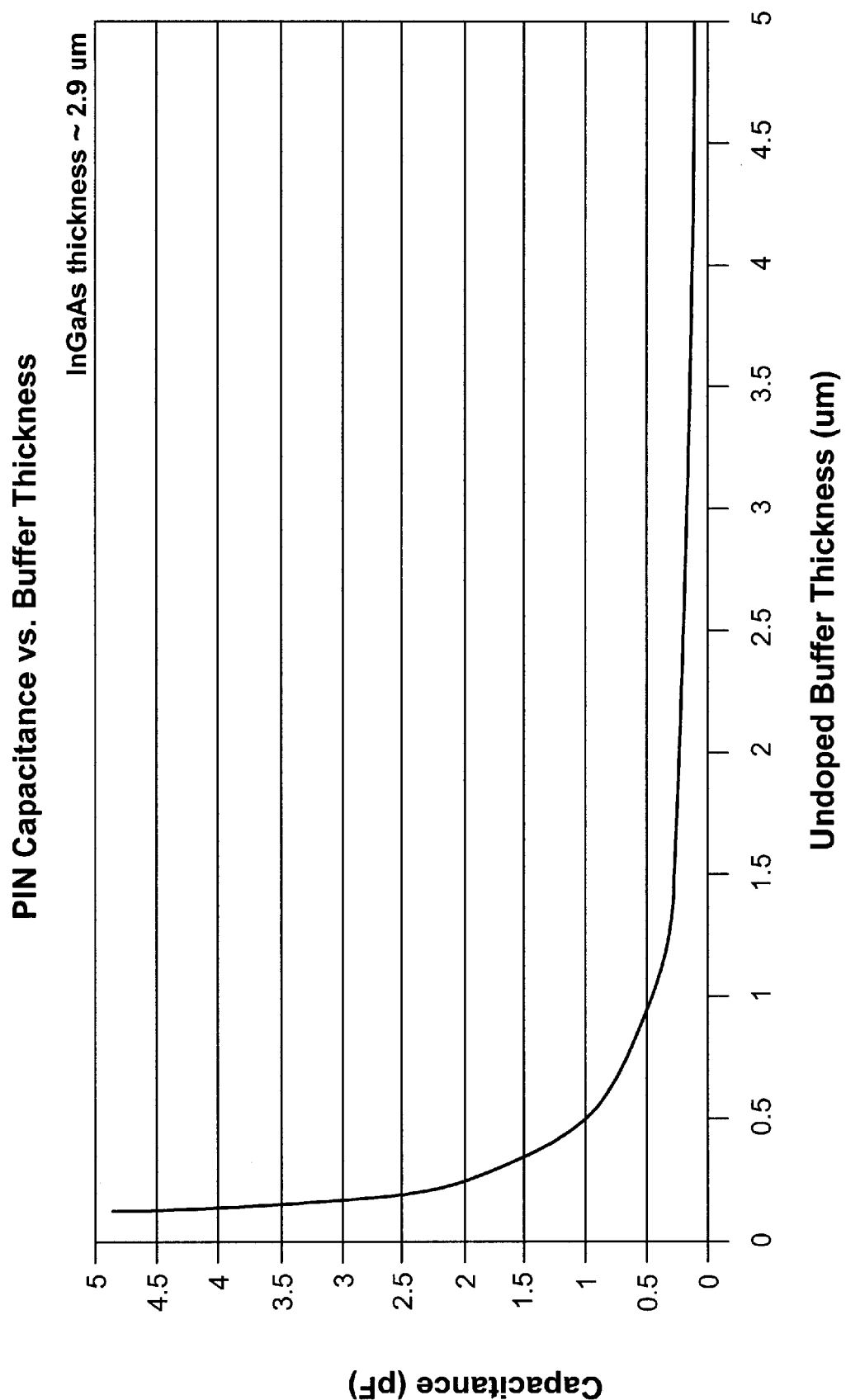
FIG. 3 is a plot of PIN photodiode capacitance as a function of buffer region thickness.
Figure 4:
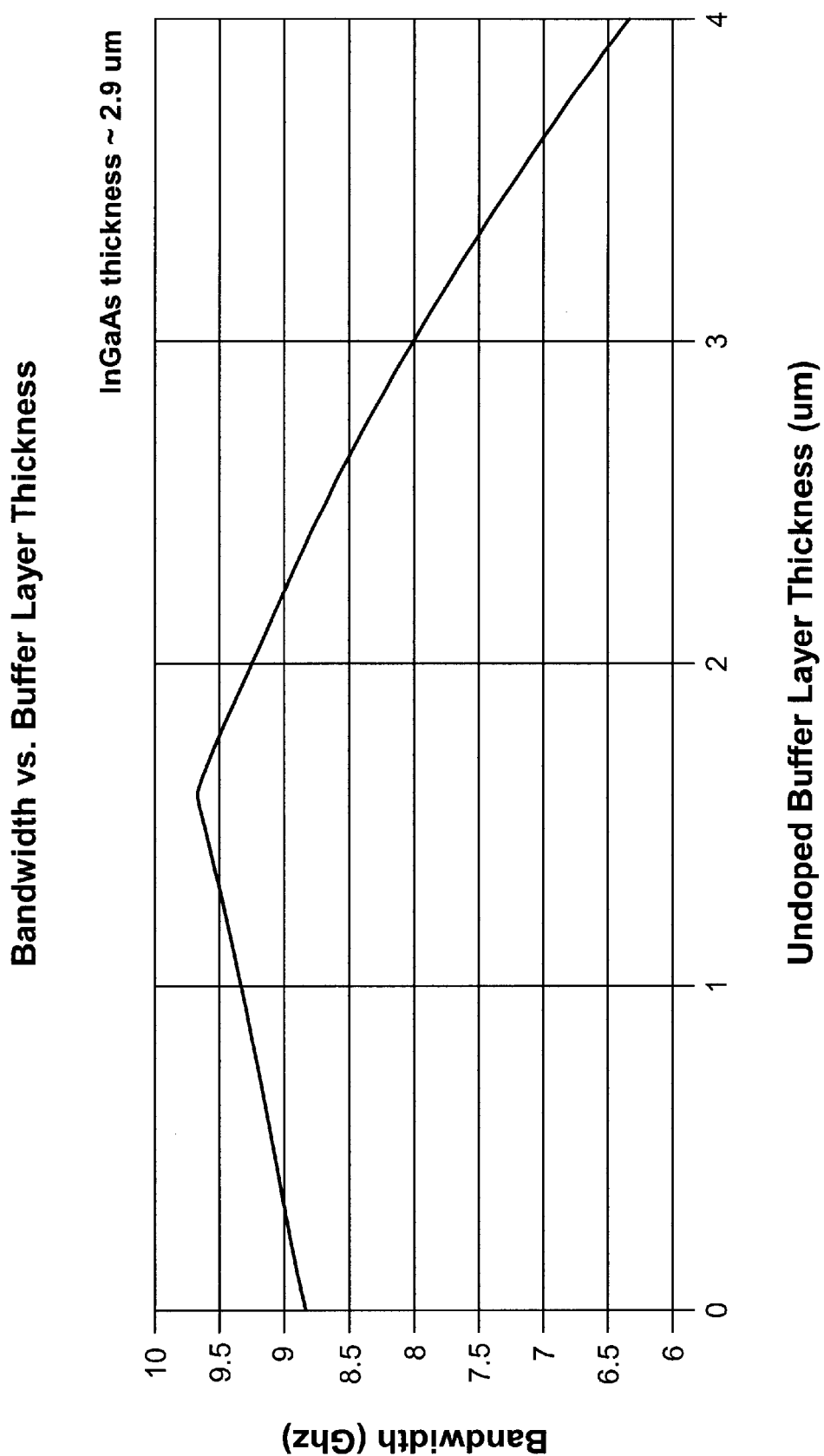
FIG. 4 is a plot of PIN photodiode bandwidth as a function of buffer region thickness.

The unexpectedly advantageous results of use of the thick buffer region 122 best can be appreciated with reference to FIGS. 3 and 4. FIG. 3 is a plot of the capacitance of a PIN photodiode having 2.9 µm thick i region as a function of buffer region thickness. As indicated in this plot, the capacitance of the photodiode decreases exponentially as the thickness of the buffer region is increased. As is further indicated by the plot, capacitance increases sharply when the buffer region is less than 0.5 µm (i.e., when the depletion region is less than 3.4 µm). Because the capacitance of the device decreases as the buffer region thickness increases, it would ostensibly be desirable to have a large buffer region 122, and therefore a large depletion region, W. As is known in the art, however, increasing the thickness of the depletion region, W, also increases transit time within the device. Although not as important as capacitance in the 10 Ghz to 20 Ghz frequency range, slow transit times delay the current output of the device to reduce bandwidth. Accordingly, it is desirable to select the thickness of the buffer region 122 to decrease capacitance without substantially increasing in transit time.

FIG. 4 is a plot of photodiode bandwidth as a function of buffer region thickness. As indicated in this plot, the bandwidth is maximized, for a photodiode having an i region thickness of 2.9 µm, with a buffer layer approximately 1.6 µm thick. Accordingly, maximum bandwidth is achieved when the depletion region, W, is approximately 4.5 µm thick (i.e., the sum of 2.9 µm and 1.6 µm). With reference again to FIG. 3, it can be appreciated that a buffer region thickness of approximately 1.6 µm results in greater than a factor of 3 decrease in capacitance as compared to conventional buffer layers on the order of 0.1 µm to 0.2 µm in thickness.

In that the alteration of the i region thickness changes the thickness of the photodiode depletion region, W, it is to be appreciated that the optimal buffer region 122 thickness may vary depending upon the thickness of the i region 106. Therefore, the thickness of the buffer region 122 can be varied when the thickness of the i region 106 is changed to maintain a constant thickness of the depletion region, W. Typically, the photodiode 100 is constructed with an i region 106 at least approximately 2.5 µm thick to ensure optimal absorption of the incident light, hv, and to maintain a quantum efficiency of at least 85%. Normally, however, the thickness of the i region 106 will not exceed approximately 3 µm since yield decreases significantly beyond that point and since quantum efficiency does not appreciably increase beyond that point. When the i region 106 is within the 2.5 µm to 3 µm range, the buffer region 122 typically is approximately 0.5 µm to 2.5 µm in thickness. This range is considered preferable in that capacitance is likely to increase sharply when the buffer region thickness is below 0.5 µm, and since capacitance reduction levels off when the buffer region thickness exceeds 2.5 µm (see FIG. 3). As indicated in FIG. 4, this buffer region thickness range, for a PIN photodiode having an i region thickness of approximately 2.9 µm, results in a bandwidth greater than 8.5 µGHz.

While preferred embodiments of the invention have been disclosed in detail in the foregoing description and drawings, it will be understood by those skilled in the art that variations and modifications thereof can be made without departing from the spirit and scope of the invention as set forth in the following claims.

What is claimed is:

1. A PIN photodiode, comprising:
   a p region containing a p type dopant;
   an n region containing an n type dopant;
   an i region positioned intermediate said p region and said n region; and
   a relatively thick, undoped buffer region positioned between said n region and said i region, wherein said buffer region substantially decreases the capacitance of said PIN photodiode such that the photodiode bandwidth is increased.

2. The photodiode of claim 1, wherein said buffer region is formed as a layer having a thickness of at least approximately 0.5 µm.

3. The photodiode of claim 2, wherein said buffer region has a thickness of approximately 0.5 $\mu$m to 2.5 $\mu$m.

4. The photodiode of claim 3, wherein said i region is formed as a layer having a thickness of at least approximately 1 $\mu$m.

5. The photodiode of claim 1, wherein said buffer region is formed as a layer having a thickness of approximately 1.6 $\mu$m.

6. The photodiode of claim 5, wherein said i region is formed as a layer having a thickness of approximately 2.9 $\mu$m.

7. The photodiode of claim 2, wherein said buffer region is made of indium phosphide.

8. A PIN photodiode, comprising:

a p region containing a p type dopant;

an n layer composed of indium phosphide and containing an n type dopant;

an i layer composed of indium gallium arsenide positioned intermediate said p region and said n region; and an undoped buffer layer composed of indium phosphide positioned between said n layer and said i layer, said butter layer being at least approximately 0.5 $\mu$m thick, wherein said butler layer substantially decreases the capacitance of said PIN photodiode such that the photodiode bandwidth is increased.

9. The photodiode of claim 8, wherein said buffer layer has a thickness of approximately 0.5 $\mu$m to 2.5 $\mu$m.

10. The photodiode of claim 9, wherein said i layer has a thickness of at least approximately 1 $\mu$m.

11. The photodiode of claim 8, wherein said buffer layer has a thickness of approximately 1.6 $\mu$m.

12. The photodiode of claim 11, wherein said i layer has a thickness of approximately 2.9 $\mu$m.

13. The photodiode of claim 8, wherein the capacitance is decreased by a factor of approximately three.

14. The photodiode of claim 8, wherein the capacitance of said photodiode is less than 1.0 pF.

15. The photodiode of claim 8, wherein the bandwidth is at least 9 Ghz.

* * * * *